(12) United States Patent
Kim et al.

(10) Patent No.: US 10,678,311 B2
(45) Date of Patent: Jun. 9, 2020

(54) MEMORY DEVICES

(71) Applicant: SAMSUNG ELECTRONICS CO., LTD., Suwon-si, Gyeonggi-Do (KR)

(72) Inventors: Jiyong Kim, Suwon-si (KR); Suin Kim, Seoul (KR); Teck Su Oh, Anyang-si (KR); Sung-Ki Lee, Seoul (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 16/260,278

(22) Filed: Jan. 29, 2019

(65) Prior Publication Data

US 2019/0354145 A1    Nov. 21, 2019

(30) Foreign Application Priority Data

May 18, 2018    (KR) .................. 10-2018-0057062

(51) Int. Cl.
*G06F 1/18*        (2006.01)
*G06F 1/20*        (2006.01)
*G06F 3/06*        (2006.01)

(52) U.S. Cl.
CPC .............. *G06F 1/181* (2013.01); *G06F 1/183* (2013.01); *G06F 1/20* (2013.01); *G06F 3/0679* (2013.01)

(58) Field of Classification Search
None
See application file for complete search history.

(56) References Cited

U.S. PATENT DOCUMENTS

| | | | |
|---|---|---|---|
| 5,099,393 A | 3/1992 | Bentlage et al. | |
| 5,171,183 A * | 12/1992 | Pollard | G06F 1/20 361/679.31 |
| 5,297,000 A * | 3/1994 | Freige | G06F 1/183 361/692 |
| 5,764,492 A | 6/1998 | Ady et al. | |
| 6,229,699 B1 * | 5/2001 | Kerrigan | G06F 1/181 174/138 G |
| 8,248,808 B2 | 8/2012 | Wei et al. | |
| 9,247,660 B2 * | 1/2016 | Bell | F16F 3/12 |
| 9,684,345 B2 | 6/2017 | Choi et al. | |
| 2003/0011287 A1 * | 1/2003 | Searby | G06F 1/181 312/223.2 |
| 2009/0002941 A1 * | 1/2009 | Mongia | G06F 1/20 361/690 |

(Continued)

FOREIGN PATENT DOCUMENTS

| | | |
|---|---|---|
| JP | 2003-258453 | 9/2003 |
| KR | 10-2013-0042293 | 4/2013 |

(Continued)

*Primary Examiner* — Xanthia C Cunningham
(74) *Attorney, Agent, or Firm* — F. Chau & Associates, LLC

(57) ABSTRACT

A memory device includes: a first casing; a second casing on the first casing; a memory module in an inner space between the first and second casings; and a plate between the first and second casings, wherein the plate includes an air hole and a wing, and wherein the wing includes: a first segment near an outside of the first and second casings; and a second segment near the inner space, wherein the first segment is located at a level different from a level of the second segment.

20 Claims, 9 Drawing Sheets

(56) References Cited

U.S. PATENT DOCUMENTS

| | | | |
|---|---|---|---|
| 2010/0061043 A1* | 3/2010 | Hsieh | F16M 13/00 361/679.01 |
| 2013/0056090 A1* | 3/2013 | Tang | G06F 1/20 137/215 |
| 2013/0231041 A1* | 9/2013 | Li | F24F 13/082 454/318 |
| 2014/0306335 A1 | 10/2014 | Mataya et al. | |
| 2015/0003008 A1* | 1/2015 | Larsen | G06F 1/203 361/679.46 |
| 2015/0036279 A1* | 2/2015 | Erdman | G06F 1/1628 361/679.31 |
| 2015/0062805 A1* | 3/2015 | Katsumata | G06F 1/20 361/679.49 |
| 2015/0092337 A1 | 4/2015 | Tan et al. | |
| 2015/0124397 A1 | 5/2015 | Dean et al. | |
| 2015/0156914 A1* | 6/2015 | Kwak | H05K 7/20254 361/689 |
| 2016/0095259 A1* | 3/2016 | Campbell | H05K 7/20181 165/138 |
| 2016/0227670 A1* | 8/2016 | Liu | H05K 7/20181 |
| 2017/0105290 A1 | 4/2017 | Kim et al. | |
| 2017/0198940 A1 | 7/2017 | Holland et al. | |
| 2019/0022568 A1* | 1/2019 | Chernansky | H02B 13/025 |

FOREIGN PATENT DOCUMENTS

| | | |
|---|---|---|
| KR | 10-2014-0004864 | 1/2014 |
| KR | 10-2017-0004148 | 1/2017 |
| KR | 10-2017-0115746 | 10/2017 |

\* cited by examiner ived in an inner space between the first and second casings;
and a plate disposed along an outer edge of the first casing,
wherein the plate includes an air hole between a first wing
and a second wing, and wherein each of the wings includes:
a first segment that extends lengthwise along the outer edge
of the first casing; and a second segment connected to the
first segment, the second segment forming an angle with the
first segment, wherein the first segment is located closer to
a bottom of the first casing than the second segment.

MEMORY DEVICES

CROSS-REFERENCE TO RELATED APPLICATION

This U.S. nonprovisional application claims priority under 35 U.S.C. § 119 to Korean Patent Application No. 10-2018-0057062 filed on May 18, 2018 in the Korean Intellectual Property Office, the disclosure of which is incorporated by reference herein in its entirety.

TECHNICAL FIELD

The inventive concept relates to a memory device, and more particularly, to a solid state drive (SSD) memory device.

DISCUSSION OF RELATED ART

A solid state drive or solid state disk (SSD) is a data storage device using integrated circuit assemblies as memory, such as flash memory, to store data persistently. The SSD is used as a replacement for a hard disk drive (HDD). In comparison with the HDD, the SSD has no moving mechanical components. Compared with the HDD, the SSD has quicker access time and lower latency.

In general, the SSD is provided in the form of a package in which memory chips are mounted on a printed circuit board. The SSD package is typically built in a closed-type housing or an open-type housing.

SUMMARY

According to an exemplary embodiment of the inventive concept, a memory device may include: a first casing; a second casing on the first casing; a memory module in an inner space between the first and second casings; and a plate between the first and second casings, wherein the plate includes an air hole and a wing, and wherein the wing includes: a first segment near an outside of the first and second casings; and a second segment near the inner space, wherein the first segment is located at a level different from a level of the second segment.

According to an exemplary embodiment of the inventive concept, a memory device may include: a first casing; a second casing on the first casing; a memory module provided in an inner space between the first and second casings; and a plate disposed along an outer edge of the first casing, wherein the plate includes an air hole between a first wing and a second wing, and wherein each of the wings include: a first portion located at the outer edge of the first casing; and a second portion protruded toward the inner space between the first and second casings, wherein the first portion and the second portion form an angle where they meet.

According to an exemplary embodiment of the inventive concept, a memory device may include: a first casing; a second casing on the first casing; a memory module pro-

DETAILED DESCRIPTION OF THE EMBODIMENTS

Figure 1A:
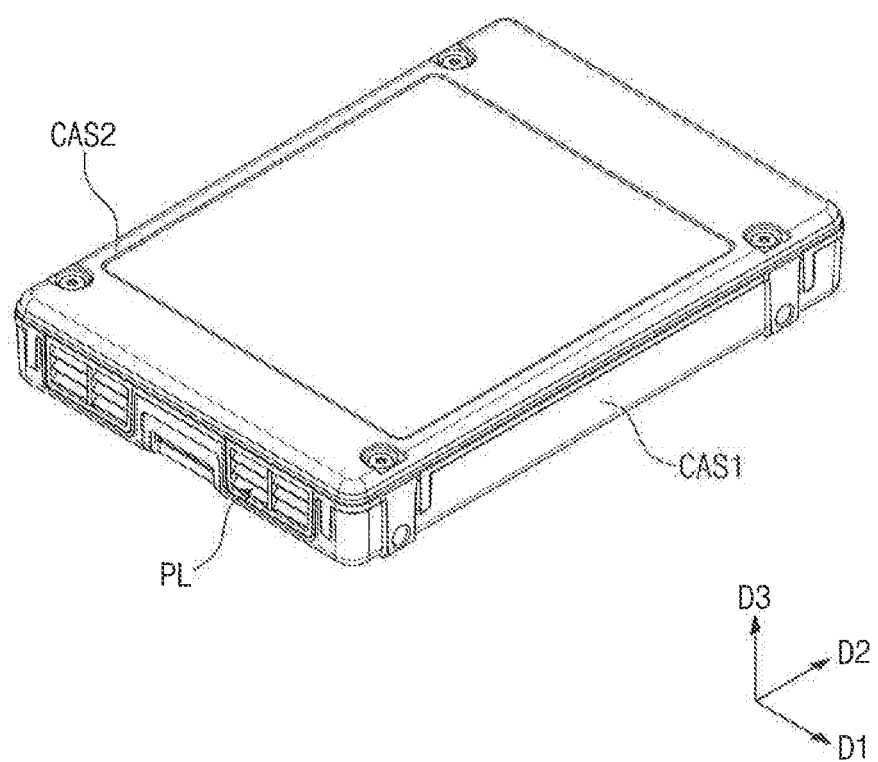
FIG. 1A illustrates a top perspective view showing a memory device according to an exemplary embodiment of the inventive concept.
Figure 1B:
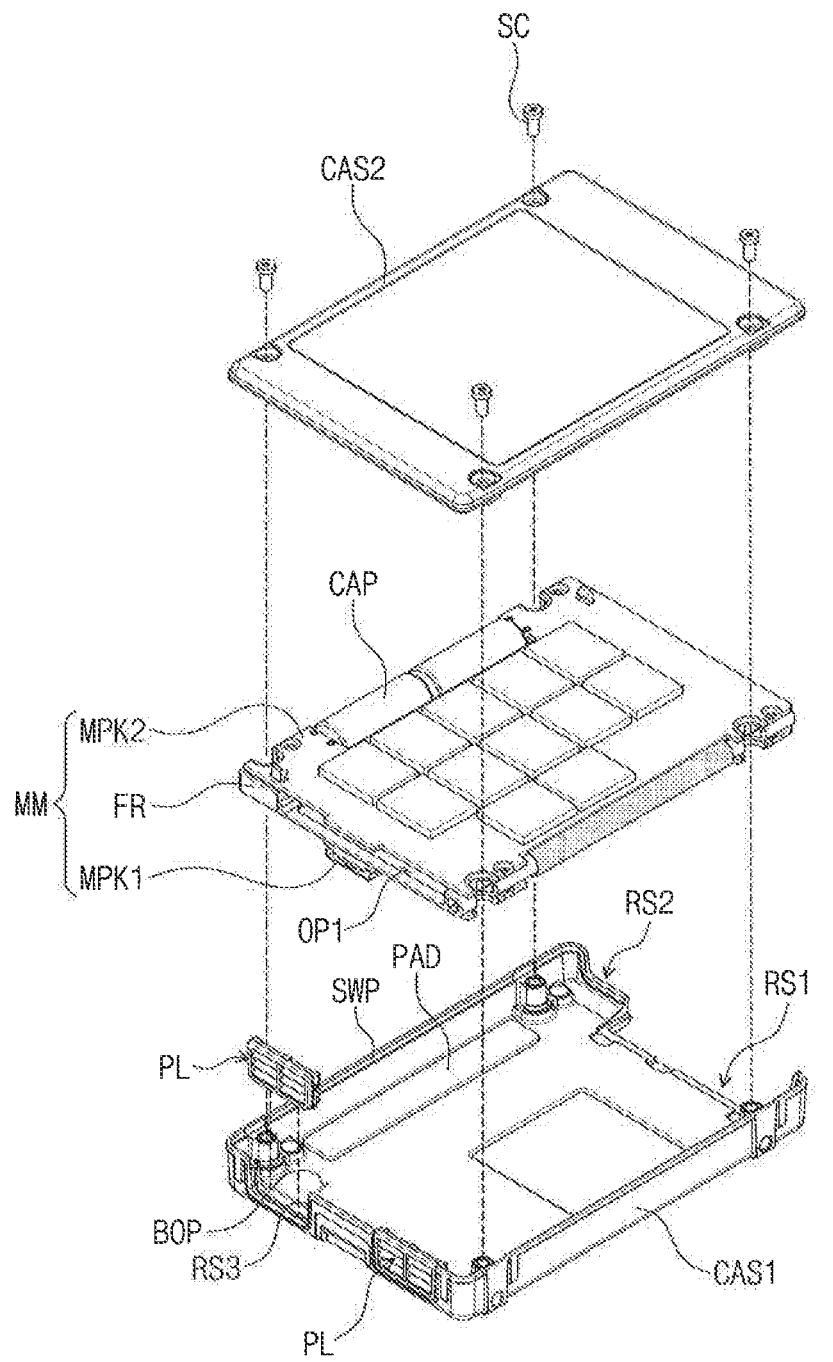
FIG. 1B illustrates an exploded perspective view of FIG. 1A according to an exemplary embodiment of the inventive concept.
Figure 2A:
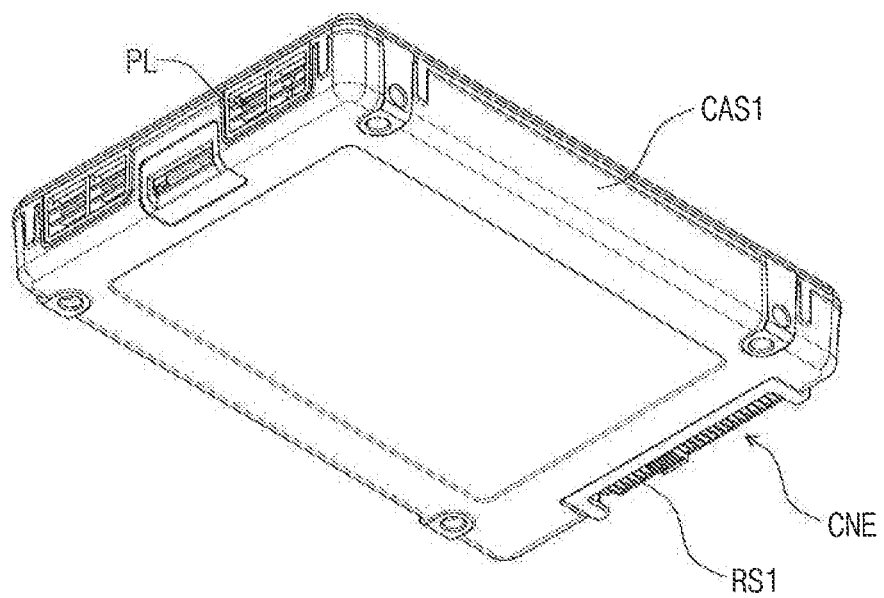
FIG. 2A illustrates a bottom perspective view showing a memory device according to an exemplary embodiment of the inventive concept.
Figure 2A:
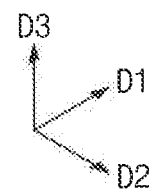
Figure 2B:
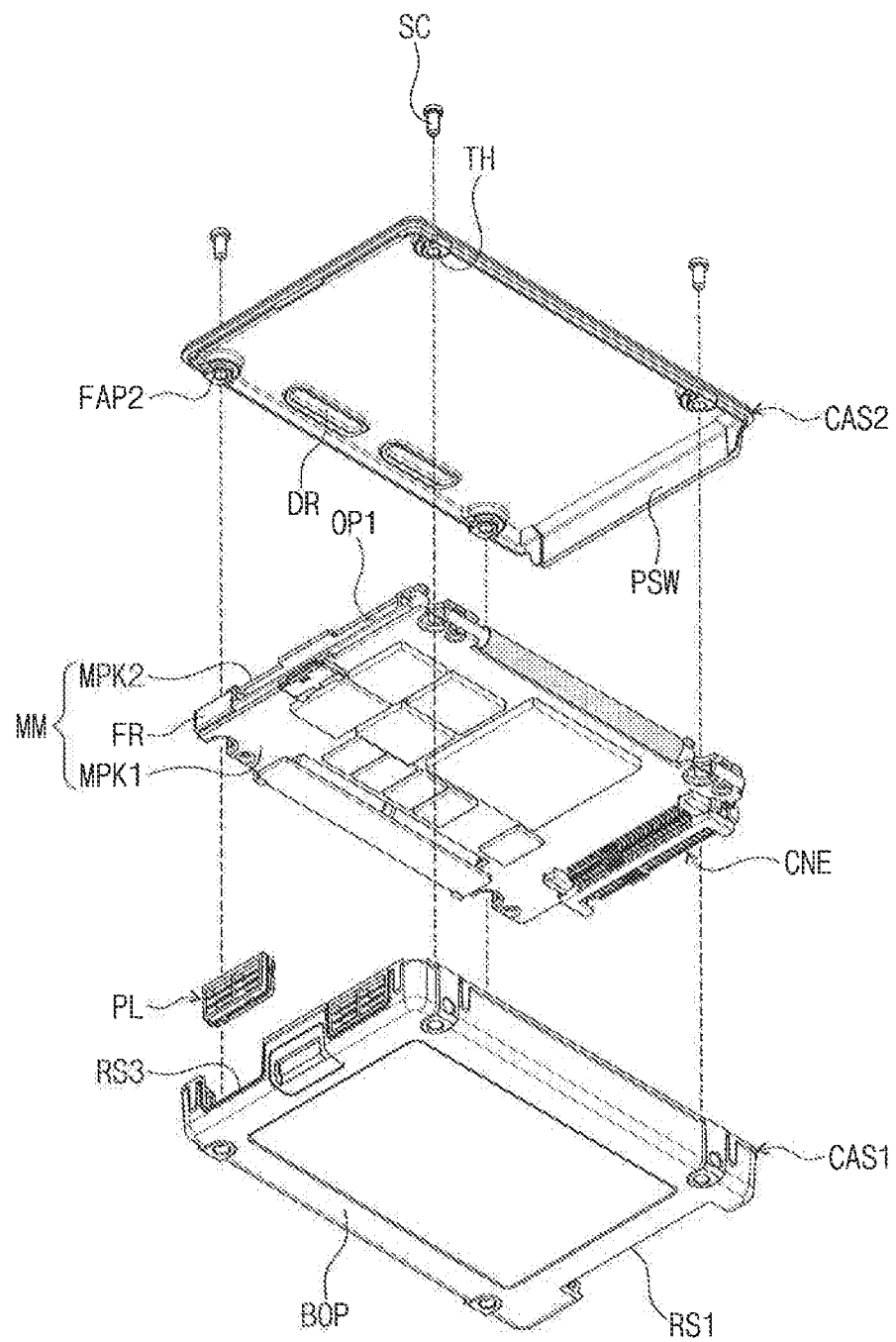
FIG. 2B illustrates an exploded perspective view of FIG. 2A according to an exemplary embodiment of the inventive concept.

FIG. 1A illustrates a top perspective view showing a memory device according to an exemplary embodiment of the inventive concept. FIG. 1B illustrates an exploded perspective view of FIG. 1A according to an exemplary embodiment of the inventive concept. FIG. 2A illustrates a bottom perspective view showing a memory device according to an exemplary embodiment of the inventive concept. FIG. 2B illustrates an exploded perspective view of FIG. 2A according to an exemplary embodiment of the inventive concept.

Referring to FIGS. 1A, 1B, 2A, and 2B, a memory device according to exemplary embodiments of the inventive concept may include a first casing CAS1, plates PL associated with the first casing CAS1, a second casing CAS2 on the first casing CAS1, and a memory module MM provided in an internal space between the first casing CAS1 and the second casing CAS2. Each of the first and second casings CAS1 and CAS2 may include metal, such as aluminum.

The first casing CAS1 may include a panel-type bottom part BOP having four sides and a sidewall part SWP vertically extending from the four sides of the bottom part BOP. For example, the sidewall part SWP may extend in a third direction D3 from the bottom part BOP.

The bottom part BOP of the first casing CAS1 may include a first recession RS1 (or first recess) that is recessed on one side of the bottom part BOP. A connector CNE, which will be discussed below, may be externally exposed through the first recession RS1 of the first casing CAS1. In other words, the connector CNE may be accessed from the outside of the memory device.

The sidewall part SWP of the first casing CAS1 may include a second recession RS2 (or second recess) that is recessed toward the first recession RS1. For example, the second recession RS2 may be recessed toward the bottom part BOP from a top surface of the sidewall part SWP. The second recession RS2 may be engaged with a protruding sidewall PSW of the second casing CAS2 which will be discussed below.

The sidewall part SWP of the first casing CAS1 may further include third recessions RS3 (or third recess) that are recessed toward the bottom part BOP from the top surface of the sidewall part SWP. For example, the third recessions RS3 may be provided on a side opposite to that on which the first and second recessions RS1 and RS2 are provided. In FIG. 1B, one of the third recessions RS3 is shown without a plate PL provided therein, while another of the third recessions RS3 is shown with a plate PL provided therein.

A pad PAD may be provided on the bottom part BOP of the first casing CAS1. A capacitor CAP of the memory module MM may be provided on the pad PAD. The pad PAD may serve as a buffer that protects the capacitor CAP.

Figure 3:
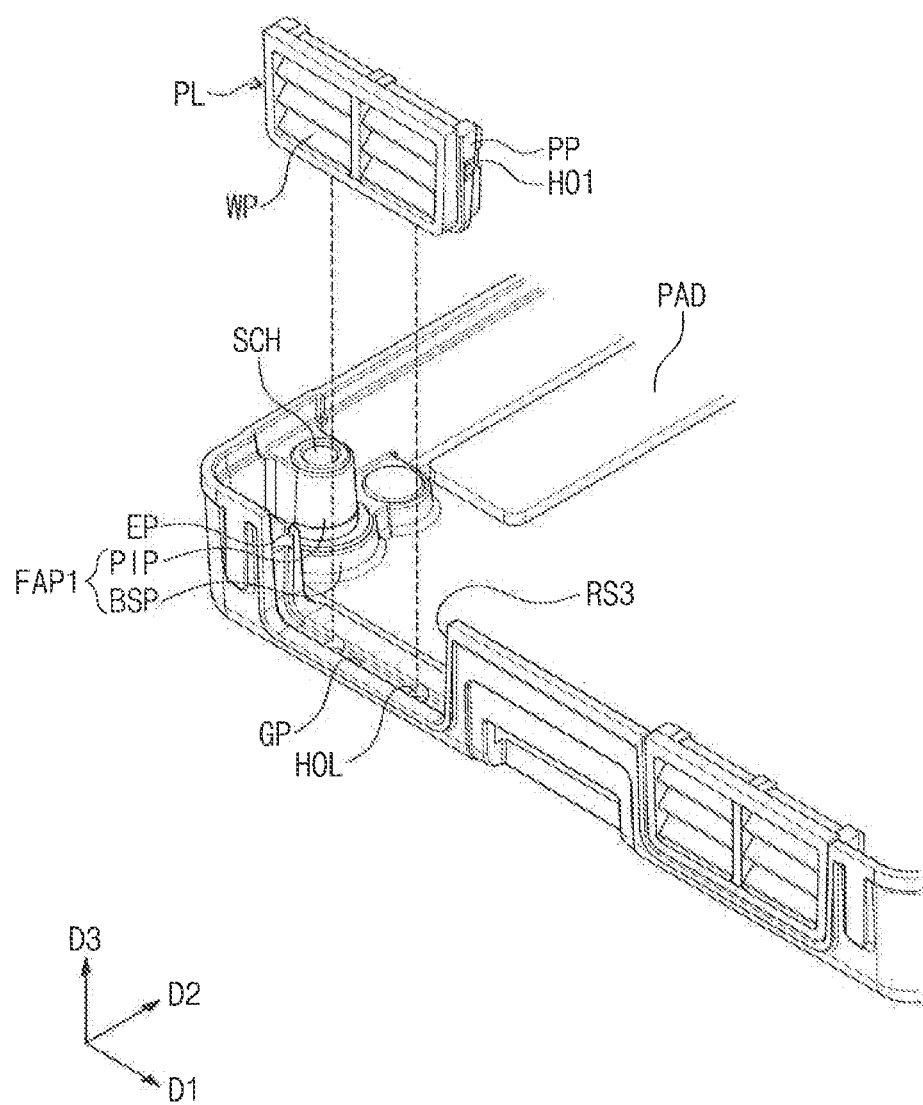
FIG. 3 illustrates a perspective view showing a plate disconnected from a third recession of a first casing shown in FIG. 1B according to an exemplary embodiment of the inventive concept.
Figure 4A:
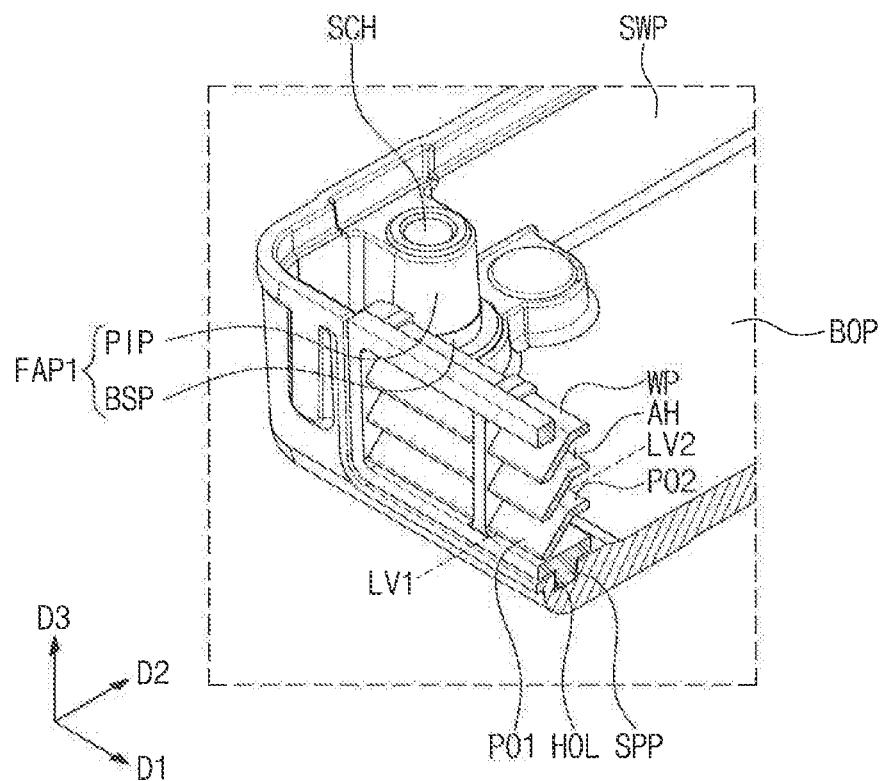
FIG. 4A illustrates a perspective view showing a cross-section of the plate shown in FIG. 3 according to an exemplary embodiment of the inventive concept.
Figure 4B:
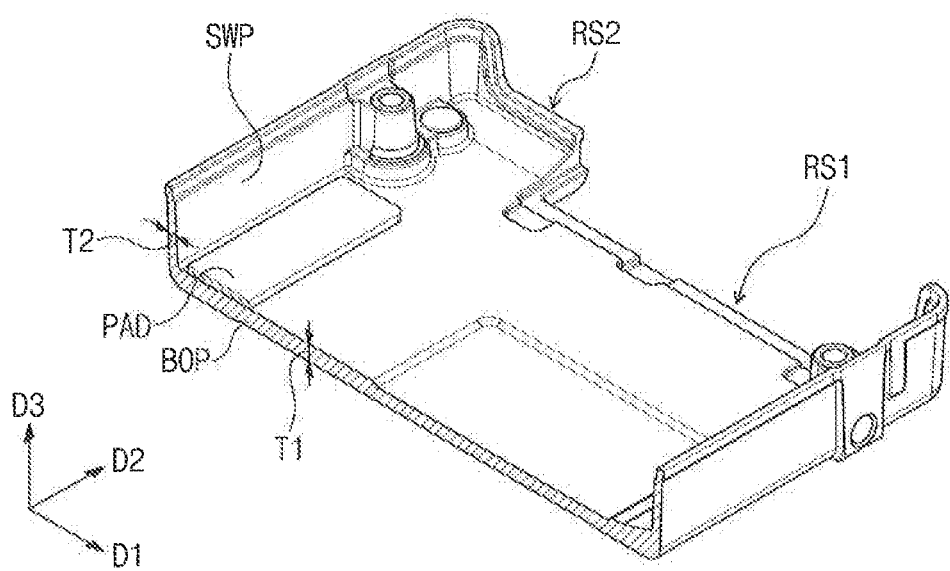
FIG. 4B illustrates a perspective view showing a cross-section of a first casing shown in FIG. 1B according to an exemplary embodiment of the inventive concept.

FIG. 3 illustrates a perspective view showing a plate disconnected from a third recession of a first casing shown in FIG. 1B according to an exemplary embodiment of the inventive concept. FIG. 4A illustrates a perspective view showing a cross-section of the plate shown in FIG. 3 according to an exemplary embodiment of the inventive concept. FIG. 4B illustrates a perspective view showing a cross-section of a first casing shown in FIG. 1B according to an exemplary embodiment of the inventive concept.

Referring to FIGS. 3, 4A, and 4B, a guide part GP may be provided in each of the third recessions RS3. The guide part GP may be a recessed trench. The guide part GP may include a locking part EP that is recessed from the guide part GP. The guide part GP may further include holes HOL that are downwardly recessed from the guide part GP. For example, the holes HOL may be recessed into the first casing CAS1.

The bottom part BOP of the first casing CAS1 may include first fastening parts FAP1 that vertically protrude. The first fastening parts FAP1 may contact the sidewall part SWP of the first casing CAS1. Each of the first fastening parts FAP1 may include a base BSP and a pillar PIP on the base BSP. The pillar PIP may include a screw hole SCH into which a screw SC is inserted. For example, the pillar PIP may have a hollow cylindrical shape.

The first casing CAS1 may be configured such that at least one of the plates PL is associated with the third recession RS3 of the sidewall part SWP. For example, two plates PL may be associated with the sidewall part SWP of the first casing CAS1. In other words, the two plates PL may be disposed in adjacent third recessions RS3 of the sidewall part SWP. The two plates PL may be spaced apart from each other in a first direction D1.

Each of the plates PL may include wings WP, which define air holes AH. The air holes AH may fluidly connect internal and external sides of the memory device. For example, the air holes AH may allow air to flow between the internal and external sides of the memory device.

Each of the wings WP may extend in a second direction D2 from outside the first casing CAS1 toward inside the first casing CAS1. The wing WP may obliquely extend. For example, the wing WP may include a first segment PO1 near an outside of the first casing CAS1 and a second segment PO2 near an inside of the first casing CAS1. The first segment PO1 may be located at a first level LV1 vertically from the bottom part BOP of the first casing CAS1. The second segment PO2 may be located at a second level LV2 vertically from the bottom part BOP of the first casing CAS1. The first and second levels LV1 and LV2 may be different from each other. For example, the second level LV2 may be higher than the first level LV1. The first segment PO1 and the second segment PO2 form an angle where they meet.

The wing WP may have a bent-shaped cross section in the second direction D2. Alternatively, the wing WP may have a curved-shaped cross section in the second direction D2. Since each of the wings WP is bent-shaped or curved-shaped, the memory module MM in the memory device may be invisible from outside the memory device.

Each of the plates PL may include a protrusion PP extending along opposite sidewalls and a bottom surface thereof. The protrusion PP may be engaged with the guide part GP of the first casing CAS1. For example, the guide part GP of the first casing CAS1 may guide the protrusion PP of the plate PL such that the plate PL may be slidably engaged with the first casing CAS1.

The protrusion PP may include a first hook HO1 that projects from the protrusion PP. The first hook HO1 may be provided on the protrusion PP on the sidewall of the plate PL. The first hook HO1 and the locking part EP may be engaged with each other to fix the plate PL to the first casing CAS1. For example, the first hook HO1 of the plate PL and the locking part EP of the first casing CAS1 may be connected each other in a snap-fit manner.

The protrusion PP may further include sub-protrusions SPP that downwardly project from the protrusion PP. The sub-protrusions SPP may be provided on the protrusion PP on the bottom surface of the plate PL. The sub-protrusions SPP may be engaged with the holes HOL of the guide part GP. For example, the sub-protrusions SPP and the holes HOL may be engaged with each other to precisely align the plate PL within the third recession RS3 of the first casing CAS1.

The plates PL may be formed of a material different from that of the first casing CAS1. For example, the plates PL may include plastic such as polyethylene (PE), polypropylene (PP), polystyrene (PS), or polyvinylchloride (PVC).

In the case that the wings WP are formed to have bent or curved shapes using the sidewall part SWP of the first casing CAS1 instead of the plates PL, the wings WP may not have a desired shape, since the sidewall part SWP is made of metal. When, however, the plates PL are formed of plastic and not integrally formed with the SWP part of the first casing CAS1, it is easier to form the wings WP having bent or curved shapes. As a result, the plates PL may be easily produced in large quantities at low cost.

The bottom part BOP of the first casing CAS1 may have a first thickness T1. The sidewall part SWP of the first casing CAS1 may have a second thickness T2. The first thickness T1 may be greater than the second thickness T2.

Figure 5:
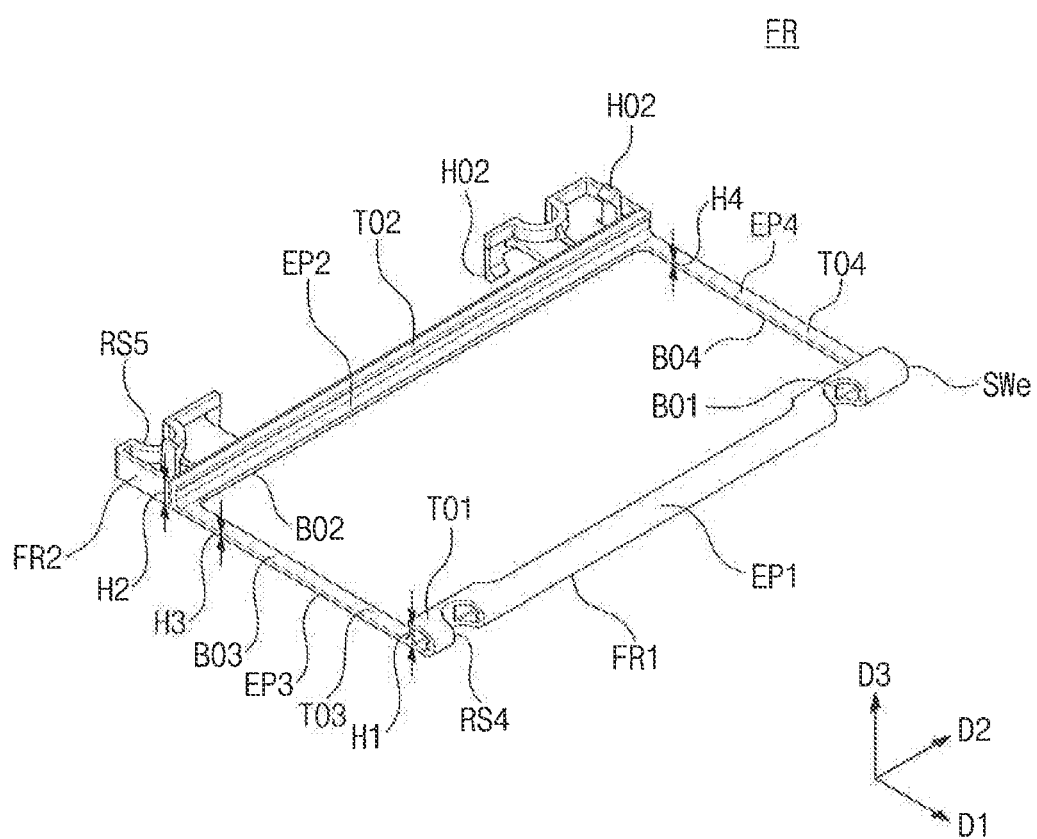
FIG. 5 illustrates a perspective view showing a frame of a memory module according to an exemplary embodiment of the inventive concept.
Figure 6:
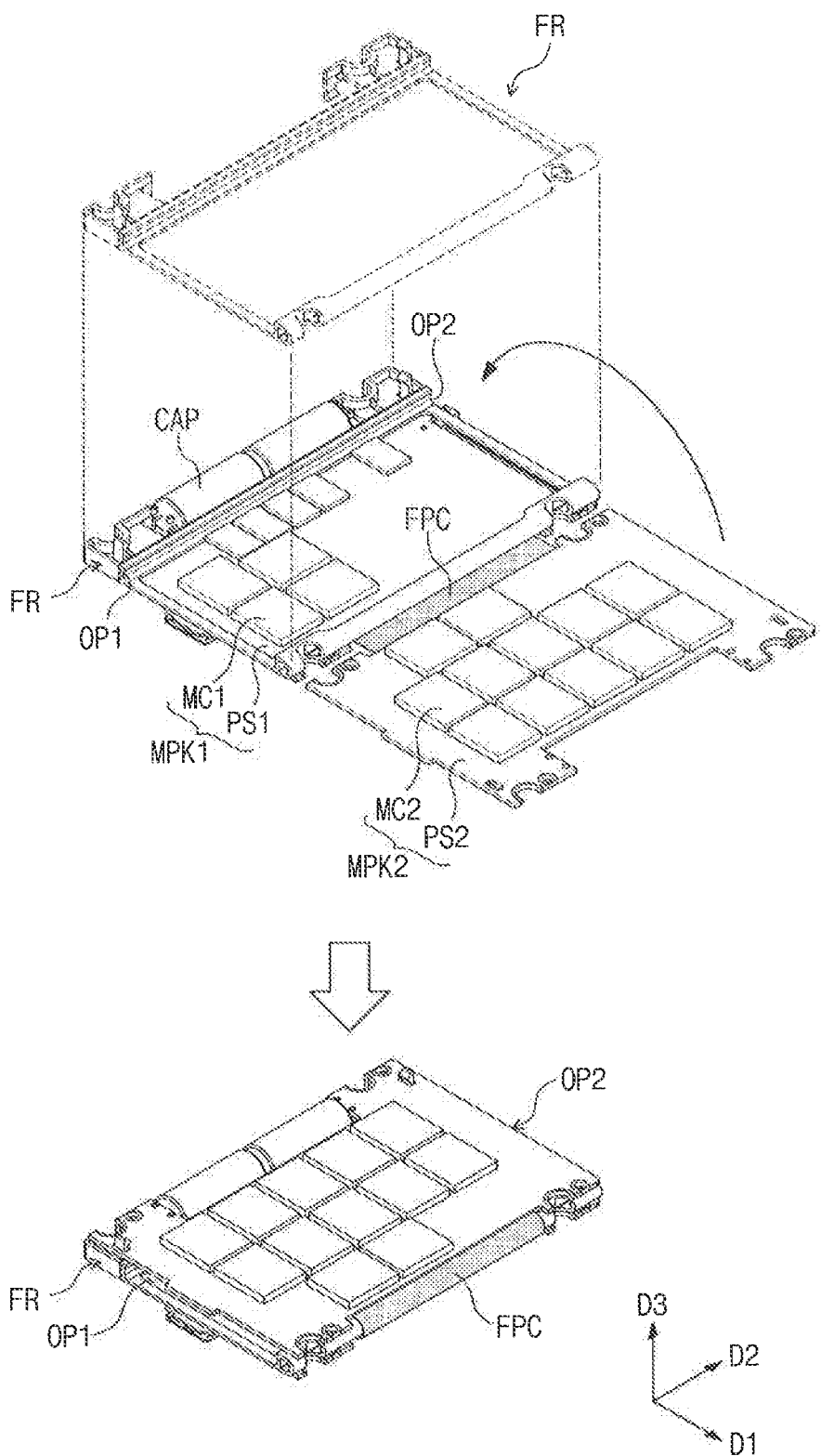
FIG. 6 illustrates a perspective view showing a memory module in which a frame is connected to first and second memory packages according to an exemplary embodiment of the inventive concept.
Figure 7:
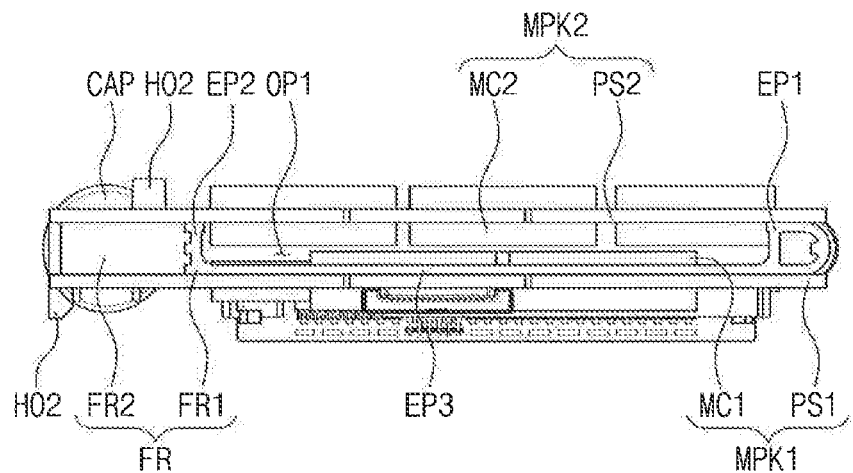
FIG. 7 illustrates a side view showing a memory module according to an exemplary embodiment of the inventive concept.
Figure 7:
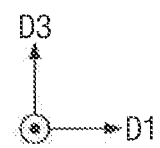

FIG. 5 illustrates a perspective view showing a frame of a memory module according to an exemplary embodiment of the inventive concept. FIG. 6 illustrates a perspective view showing a memory module in which a frame is connected to first and second memory packages according to an exemplary embodiment of the inventive concept. FIG. 7 illustrates a side view showing a memory module according to an exemplary embodiment of the inventive concept.

Referring to FIGS. 5, 6, and 7, the memory module MM may be disposed on the first casing CAS1. The memory module MM may be disposed in an inner space between the first and second casings CAS1 and CAS2. The memory module MM may include a first memory package MPK1, a second memory package MPK2, a frame FR sandwiched between the first and second memory packages MPK1 and MPK2, a capacitor CAP, and a connector (see CNE of FIG. 2B).

The first memory package MPK1 may include a first package substrate PS1 and first memory chips MC1 mounted on the first package substrate PS1. The first memory chips MC1 may be disposed on top and bottom surfaces of the first package substrate PS1. The second memory package MPK2 may include a second package substrate PS2 and second memory chips MC2 mounted on the second package substrate PS2. The second memory chips MC2 may be disposed on top and bottom surfaces of the second package substrate PS2. Each of the first and second package substrates PS1 and PS2 may be a printed circuit board (PCB). For example, each of the first and second memory packages MPK1 and MPK2 may be a solid state drive (SSD) package.

The capacitor CAP may be provided on a side of the frame FR and electrically connected to the first and second memory packages MPK1 and MPK2. The capacitor CAP may have a cylindrical shape. The connector CNE may be combined with the first package substrate PS1. The connector CNE may be externally exposed through the first recession RS1 of the first casing CAS1.

A flexible printed circuit film FPC may be provided to electrically connect the first and second memory packages MPK1 and MPK2 to each other. The flexible printed circuit film FPC may include conductive lines through which the first and second memory packages MPK1 and MPK2 are electrically connected to each other.

The frame FR may include a first frame FR1 and a second frame FR2. The first and second frames FR1 and FR2 may include different materials from each other. For example, the first frame FR1 may include metal (e.g., aluminum), and the second frame FR2 may include plastic (e.g., PE, PP, PS, or PVC). The inventive concept is not, however, limited to the materials discussed above. For example, the first and second frames FR1 and FR2 may be formed of the same plastic as each other to constitute a single frame FR.

The first frame FR1 may include a first extension EP1 and a second extension EP2 that extend in parallel to the second direction D2. The first frame FR1 may include a third extension EP3 and a fourth extension EP4 that extend in parallel to the first direction D1. The third extension EP3 may connect a first end of the first extension EP1 to a first end of the second extension EP2. The fourth extension EP4 may connect a second end of the first extension EP1 to a second end of the second extension EP2. The second end of the first extension EP1 may be opposite to the first end of the first extension EP1, and the second end of the second extension EP2 may be opposite to the first end of the second extension EP2. When viewed in plan, the first frame FR1 may have a tetragonal shape having four sides.

The first extension EP1 may have an outer sidewall SWe whose shape is curved. The flexible printed circuit film FPC may cover the outer sidewall SWe of the first extension EP1. For example, the flexible printed circuit film FPC may be curved along the outer sidewall SWe of the first extension EP1.

The first extension EP1 may have a first height H1 in the third direction D3, and the second extension EP2 may have a second height H2 in the third direction D3. The first and second heights H1 and H2 may be substantially the same as each other. For example, the first extension EP1 may have a top surface TO1 at substantially the same level as that of a top surface T02 of the second extension EP2. In addition, the first extension EP1 may have a bottom surface BO1 at substantially the same level as that of a bottom surface BO2 of the second extension EP2.

The third extension EP3 may have a third height H3 in the third direction D3, and the fourth extension EP4 may have a fourth height H4 in the third direction D3. The third and fourth heights H3 and H4 may be substantially the same as each other. Each of the third and fourth heights H3 and H4 may be less than each of the first and second heights H1 and H2. The bottom surfaces BO3 and B04 of the third and fourth extensions EP3 and EP4 may be at substantially the same level as that of the bottom surfaces BO1 and B02 of the first and second extensions EP1 and EP2. The top surfaces T03 and T04 of the third and fourth extensions EP3 and EP4 may be lower than the top surfaces TO1 and T02 of the first and second extensions EP1 and EP2. For example, the third and fourth extensions EP3 and EP4 may connect the bottom surface BO1 of the first extension EP1 to the bottom surface B02 of the second extension EP2.

The first package substrate PS1 may be disposed on and in contact with the bottom surfaces BO1, B02, B03 and B04 of the first, second, third and fourth extensions EP1, EP2, EP3 and EP4. The second package substrate PS2 may be disposed on and in contact with the top surfaces TO1 and T02 of the first and second extensions EP1 and EP2. Since each of the third and fourth extensions EP3 and EP4 has a height (e.g., H3 and H4) less than a height (e.g., H1 and H2) of each of the first and second extensions EP1 and EP2, the second package substrate PS2 may be vertically spaced apart from the top surfaces T03 and T04 of the third and fourth extensions EP3 and EP4.

A first opening OP1 may be defined by the first, second, and third extensions EP1, EP2, and EP3 and by the second package substrate PS2. A second opening OP2 may be defined by the first, second, and fourth extensions EP1, EP2, and EP4 and by the second package substrate PS2. For example, since the second package substrate PS2 is vertically spaced apart from the third and fourth extensions EP3 and EP4, the first and second openings OP1 and OP2 may be present.

The first and second openings OP1 and OP2 may expose the first memory chips MC1 mounted on the first package substrate PS1 and also expose the second memory chips MC2 mounted on the second package substrate PS2. Since the first and second memory chips MC1 and MC2 are exposed, air flow may allow heat to radiate from the first and second memory chips MC1 and MC2. For example, the first opening OP1 may be adjacent to the plates PL on which the air holes AH are formed, and the second opening OP2 may be adjacent to the first recession RS1. Air may unidirectionally flow between the first recession RS1 and the air holes AH. Air may flow between the first and second openings OP1 and OP2. The first and second openings OP1 and OP2 may receive and externally discharge heat generated from the first and second memory chips MC1 and MC2. In other words, heat may be dissipated to the outside of the memory device via the first and second openings OP1 and OP2.

The second frame FR2 may include second hooks HO02 that vertically protrude. One or a plurality of the second hooks HO02 may be coupled to the first package substrate PS1, and thus, the first package substrate PS1 may be fixed on the frame FR. The remainder of the second hooks HO02 may be coupled to the second package substrate PS2, and thus, the second package substrate PS2 may be fixed on the frame FR.

As discussed above, the second frame FR2 may be formed of resilient plastic. Accordingly, when the first and second package substrates PS1 and PS2 are fixed on the frame FR, the second hooks HO02 may be resiliently deformed to be easily coupled to the first and second package substrates PS1 and PS2. The first frame FR1 may be formed of metal having excellent thermal conductivity. Therefore, heat may be externally discharged at high speed from the first and second memory chips MC1 and MC2.

The first frame FR1 may include recessed fourth recessions RS4 (or fourth recess), and the second frame FR2 may include recessed fifth recessions RS5 (or fifth recess). The fourth and fifth recessions RS4 and RS5 may be engaged with the pillars PIP of the first fastening parts FAP1. The first package substrate PS1 may be disposed on top surfaces of the bases BSP of the first fastening parts FAP1. Therefore, the first package substrate PS1 may directly contact the bases BSP of the first fastening parts FAP1. As discussed above, the capacitor CAP may be disposed on and in direct contact with the pad PAD on the bottom part BOP of the first casing CAS1. The pad PAD may include a buffer material, which protects the capacitor CAP from external impact.

Referring back to FIG. 2B, the second casing CAS2 may have a panel shape having four sides. The second casing CAS2 may have a bottom surface including a depression DR. The depression DR may be provided on a location corresponding to that of the capacitor CAP. The second casing CAS2 may be disposed on the first casing CAS1, and the capacitor CAP of the memory module MM may have an upper portion inserted into the depression DR of the second casing CAS2.

The second casing CAS2 may include a protruding sidewall PSW that vertically protrudes from one side of the second casing CAS2. The protruding sidewall PSW may be engaged with the second recession RS2 of the first casing CAS1. When the protruding sidewall PSW is engaged with second recession RS2, the first recession RS2 of the first casing CAS1 may externally expose the connector CNE.

The second casing CAS2 may include second fastening parts FAP2. The second fastening parts FAP2 may be positioned on locations corresponding to those of the first fastening parts FAP1. Each of the second fastening parts FAP2 may include a through hole TH through which a screw SC passes. The through hole TH may be spatially connected to the screw hole SCH in the pillar PIP of the first fastening part FAP1. When the screw SC is inserted into the through hole TH of the second fastening part FAP2 and into the screw hole SCH of the first fastening FAP1, the second casing CAS2 may be fixed onto the first casing CAS1.

Figure 8:
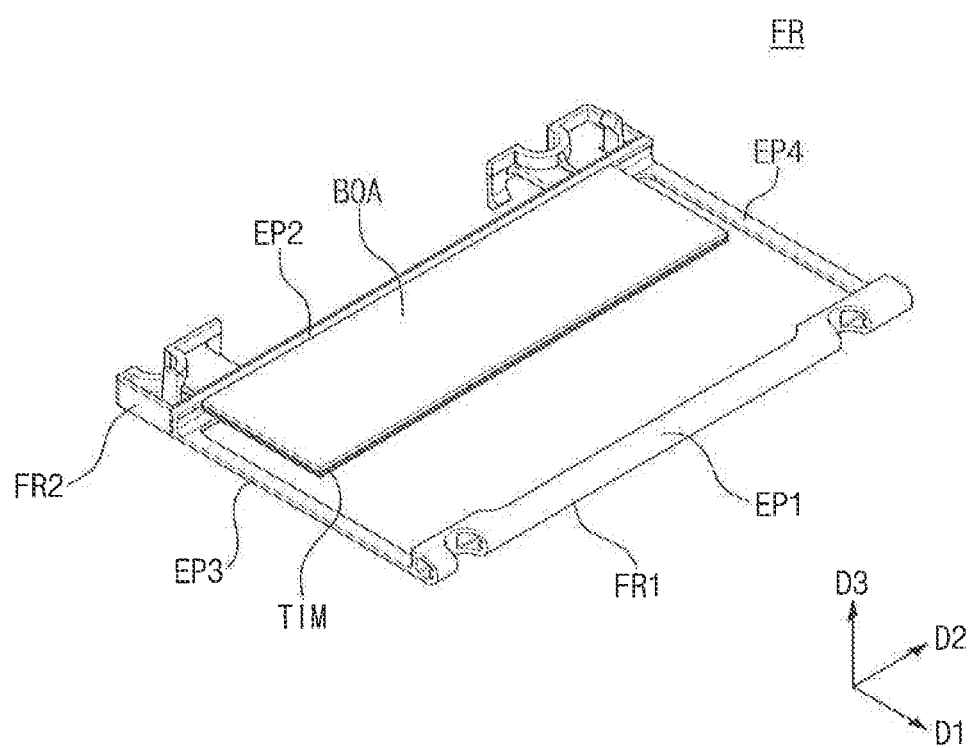
FIG. 8 illustrates a perspective view showing a frame of a memory module according to an exemplary embodiment of the inventive concept.

FIG. 8 illustrates a perspective view showing a frame of a memory module according to an exemplary embodiment of the inventive concept. In the embodiment that follows, a detailed description of elements similar to those discussed above with reference to FIGS. 5, 6, and 7 may be omitted.

Referring to FIGS. 6, 7, and 8, the frame FR may include a board BOA connected to an upper portion of the second extension EP2 and a thermal interface film TIM on one surface of the board BOA. For example, the thermal interface film TIM may contact the first memory chips MC1 of the first memory package MPK1 that are disposed on the frame FR. In this case, the thermal interface film TIM may be disposed between the board BOA and the bottoms surface of the frame FR.

The thermal interface film TIM may have a relatively high thermal conductivity. For example, the thermal interface film TIM may include particles whose thermal conductivity is high. The thermal interface film TIM may externally discharge heat at high speed from the first memory chips MC1.

According to an exemplary embodiment of the inventive concept, a memory device may be configured such that a casing may be engaged with a plate having an air hole through which heat is externally discharged from inside the casing. In this case, it is possible to easily provide wings having bent or curved shapes defining the air hole.

According to another exemplary embodiment of the inventive concept, a frame between memory packages may define an opening that exposes memory chips. The opening may allow heat to externally radiate from the memory chips.

While the inventive concept has been described with reference to exemplary embodiments thereof, it will be understood by those of ordinary skill in the art that various changes in form and details may be made thereto without departing from the spirit and scope of inventive concept as set forth in the following claims.

What is claimed is:

1. A memory device, comprising:
   a first casing;
   a second casing on the first casing;
   a memory module in an inner space between the first and second casings; and
   a plate between the first and second casings,
   wherein the plate comprises an air hole and a wing, and
   wherein the wing comprises:
     a first segment near an outside of the first and second casings; and
     a second segment near the inner space,
     wherein the first segment is located at a level different from a level of the second segment.

2. The memory device of claim 1, wherein the air hole allows air to flow from the outside to the inner space.

3. The memory device of claim 1, wherein the first segment and the second segment of the wing are connected to each other such that they make an angle.

4. The memory device of claim 1, wherein the wing has a bent shape or a curved shape.

5. The memory device of claim 1, wherein
   a sidewall part of the first casing comprises a recession that is recessed toward a bottom part of the first casing,
   the recession comprises a guide part, and
   the plate comprises a protrusion,
   wherein the guide part is configured to receive the protrusion.

6. The memory device of claim 5, wherein
   the guide part comprises a locking part, and
   the protrusion comprises a hook,
   wherein the hook and the locking part are connected to each other when the plate is inserted into the recession.

7. The memory device of claim 5, wherein the protrusion of the plate comprises a sub-protrusion,
   wherein the sub-protrusion is engaged with a hole of the guide part when the plate is inserted into the recession.

8. The memory device of claim 5, wherein a thickness of the bottom part of the first casing is greater than a thickness of the sidewall part of the first casing.

9. The memory device of claim 1, wherein
   the first and second casings comprise metal, and
   the plate comprises plastic.

10. The memory device of claim 1, wherein the memory module comprises a solid state drive (SSD) package.

11. The memory device of claim 1, wherein the first casing comprises a recession exposing a connector of the memory module,
 wherein the recession and the air hole allow air to flow between the inner space and the outside.

12. The memory device of claim 1, wherein the memory module comprises:
 a first memory package;
 a second memory package on the first memory package; and
 a frame between the first and second memory packages, and
 wherein the frame comprises:
  a first extension extending in a first direction; and
  a second extension extending in a second direction intersecting the first direction,
   wherein a height of the first extension is greater than a height of the second extension.

13. The memory device of claim 12, wherein each of the first and second memory packages comprises:
 a package substrate; and
 a memory chip mounted on the package substrate,
 wherein the package substrate of the first memory package is disposed on the first and second extensions, and
 wherein the package substrate of the second memory package is disposed on the first extension and spaced apart from the second extension.

14. The memory device of claim 13, wherein the memory chips of the first and second memory packages are exposed through an opening between the second extension and the package substrate of the second memory package.

15. The memory device of claim 14, wherein the air hole is adjacent to the opening.

16. The memory device of claim 12, wherein
 the first extension comprises a pair of first extensions extending in parallel to the first direction, and
 the second extension comprises a pair of second extensions extending in parallel to the second direction,
 wherein each of the pair of second extensions connects the pair of first extensions to each other.

17. The memory device of claim 12, wherein
 the frame comprises:
  a first frame including the first and second extensions; and
  a second frame facing the first extension of the first frame, and
 the second frame comprises hooks,
 wherein the hooks connect the first and second memory packages to the frame.

18. The memory device of claim 1, wherein the memory module comprises:
 a first memory package;
 a second memory package on the first memory package; and
 a frame between the first and second memory packages,
 wherein the first memory package comprises a first package substrate and a first memory chip mounted on the first package substrate,
 wherein the second memory package comprises a second package substrate and a second memory chip mounted on the second package substrate,
 wherein the first package substrate is disposed adjacent to a bottom surface of the frame,
 wherein the second package substrate is disposed adjacent to a top surface of the frame, and
 wherein an opening is provided between the first and second package substrates, the opening exposing the first and second memory chips.

19. A memory device, comprising:
 a first casing;
 a second casing on the first casing;
 a memory module provided in an inner space between the first and second casings; and
 a plate disposed along an outer edge of the first casing,
 wherein the plate comprises an air hole between a first wing and a second wing, and
 wherein each of the wings comprises:
  a first portion located at the outer edge of the first casing; and
  a second portion protruded toward the inner space between the first and second casings,
 wherein the first portion and the second portion form an angle where they meet.

20. A memory device, comprising:
 a first casing;
 a second casing on the first casing;
 a memory module provided in an inner space between the first and second casings; and
 a plate disposed along an outer edge of the first casing,
 wherein the plate comprises an air hole between a first wing and a second wing, and
 wherein each of the wings comprises:
  a first segment that extends lengthwise along the outer edge of the first casing; and
  a second segment connected to the first segment, the second segment forming an angle with the first segment,
 wherein the first segment is located closer to a bottom of the first casing than the second segment.

* * * * *